/ United States Patent /

(12) United States Patent
Oohiraki et al.

(10) Patent No.: US 10,607,915 B2
(45) Date of Patent: Mar. 31, 2020

(54) JOINED BODY MANUFACTURING METHOD, MULTILAYER JOINED BODY MANUFACTURING METHOD, POWER-MODULE SUBSTRATE MANUFACTURING METHOD, HEAT SINK EQUIPPED POWER-MODULE SUBSTRATE MANUFACTURING METHOD, AND LAMINATED BODY MANUFACTURING DEVICE

(71) Applicant: MITSUBISHI MATERIALS CORPORATION, Tokyo (JP)

(72) Inventors: Tomoya Oohiraki, Kitamoto (JP); Sotaro Oi, Kitamoto (JP); Kimihito Nishikawa, Sunto-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/320,441

(22) PCT Filed: Jun. 30, 2015

(86) PCT No.: PCT/JP2015/068885
§ 371 (c)(1),
(2) Date: Dec. 20, 2016

(87) PCT Pub. No.: WO2016/002804
PCT Pub. Date: Jan. 7, 2016

(65) Prior Publication Data
US 2017/0141011 A1 May 18, 2017

(30) Foreign Application Priority Data

Jul. 2, 2014 (JP) ................. 2014-136646
Nov. 20, 2014 (JP) ................. 2014-235949
Jun. 30, 2015 (JP) ................. 2015-130973

(51) Int. Cl.
*H01L 23/373* (2006.01)
*C04B 37/02* (2006.01)
(Continued)

(52) U.S. Cl.
CPC ............ *H01L 23/3735* (2013.01); *B32B 7/04* (2013.01); *B32B 7/05* (2019.01); *B32B 7/12* (2013.01);
(Continued)

(58) Field of Classification Search
CPC ..... H01L 2224/291; H01L 2924/00014; H01L 2924/014; H01L 21/4882;
(Continued)

(56) References Cited

U.S. PATENT DOCUMENTS 4,209,477 A * 6/1980 Yanagida ................. C04B 33/32
264/125
4,713,284 A * 12/1987 Hasegawa ............... B32B 15/08
442/233
(Continued)

FOREIGN PATENT DOCUMENTS

JP 07-224270 A 8/1995
JP H11-238961 8/1999
(Continued)

OTHER PUBLICATIONS

Written Opinion of WO2016002804.*
(Continued)

*Primary Examiner* — Sonya M Sengupta
(74) *Attorney, Agent, or Firm* — Locke Lord LLP; James E. Armstrong, IV; Nicholas J. DiCeglie, Jr.

(57) ABSTRACT

A joined body manufacturing method includes: a laminating step for forming a laminated body in which either a copper circuit substrate (first member) or a ceramic substrate (second member) is coated beforehand with a temporary fixing
(Continued)

material the main ingredient of which is a saturated fatty acid, the copper circuit substrate and the ceramic substrate are stacked and positioned by the temporary fixing material which has been melted, and by cooling the temporary fixing material the stacked copper substrate and ceramic substrate are temporarily fixed; and a joining step for forming a joined body in which the copper circuit substrate and the ceramic substrate are joined by heating with pressurizing the laminated body in the stacking direction.

18 Claims, 7 Drawing Sheets

(51) Int. Cl.
| | | |
|---|---|---|
| B32B 7/12 | (2006.01) | |
| C04B 35/645 | (2006.01) | |
| B32B 9/04 | (2006.01) | |
| B32B 9/00 | (2006.01) | |
| B32B 15/00 | (2006.01) | |
| B32B 15/20 | (2006.01) | |
| B32B 15/04 | (2006.01) | |
| B32B 7/04 | (2019.01) | |
| B32B 7/05 | (2019.01) | |
| H01L 23/492 | (2006.01) | |
| H01L 23/12 | (2006.01) | |
| H01L 23/00 | (2006.01) | |
| H01L 23/36 | (2006.01) | |
| H01L 21/48 | (2006.01) | |

(52) U.S. Cl.
CPC ............ *B32B 9/005* (2013.01); *B32B 9/041* (2013.01); *B32B 15/00* (2013.01); *B32B 15/043* (2013.01); *B32B 15/20* (2013.01); *C04B 35/645* (2013.01); *C04B 37/028* (2013.01); *H01L 23/4924* (2013.01); B32B 2250/44 (2013.01); B32B 2307/20 (2013.01); B32B 2307/732 (2013.01); B32B 2457/00 (2013.01); C04B 2235/449 (2013.01); C04B 2237/343 (2013.01); C04B 2237/366 (2013.01); C04B 2237/368 (2013.01); C04B 2237/402 (2013.01); C04B 2237/407 (2013.01); C04B 2237/706 (2013.01); C04B 2237/86 (2013.01); H01L 21/4882 (2013.01); H01L 23/12 (2013.01); H01L 23/36 (2013.01); *H01L 24/29* (2013.01); *H01L 24/32* (2013.01); H01L 2224/291 (2013.01); H01L 2224/32225 (2013.01)

(58) Field of Classification Search
CPC .......... H01L 2224/32225; H01L 23/12; H01L 23/36; H01L 23/3735; H01L 23/4924; H01L 24/29; H01L 24/32; C04B 2235/449; C04B 2237/343; C04B 2237/366; C04B 2237/368; C04B 2237/402; C04B 2237/407; C04B 2237/70; C04B 37/028; B32B 15/00; B32B 15/043; B32B 15/20; B32B 2250/44; B32B 2307/20; B32B 2307/732; B32B 2457/00; B32B 7/04; B32B 7/05; B32B 7/12; B32B 9/005; B32B 9/041
See application file for complete search history.

(56) References Cited

U.S. PATENT DOCUMENTS

| | | | |
|---|---|---|---|
| 4,763,828 A * | 8/1988 | Fukaya | ................ C04B 37/026 228/124.1 |
| 55,815,025 | 12/1996 | Yoshikawa et al. | |
| 2015/0041188 A1 | 2/2015 | Terasaki et al. | |

FOREIGN PATENT DOCUMENTS

| | | | |
|---|---|---|---|
| JP | 2004-039915 A | | 2/2004 |
| JP | 2007-194256 A | | 8/2007 |
| JP | 2009-235218 A | | 10/2009 |
| JP | 2010-010561 A | | 1/2010 |
| JP | 2013-229545 A | | 11/2013 |

OTHER PUBLICATIONS

Translation of JP2013229545.*
Translation of JP2004039915.*
Translation of JP2007194256.*
Translation of JP2010010561.*
Translation of JP2009235218.*
Translation of JP07-224270.*
International Search Report dated Sep. 8, 2015, issued for PCT/JP2015/068885.
Supplementary European Search Report dated Mar. 5, 2018, issued for the corresponding European Patent Application No. 15815025.0.
Office Action issued in corresponding Chinese Patent Application No. CN 201580033623.1, dated Sep. 4, 2018.

* cited by examiner

JOINED BODY MANUFACTURING METHOD, MULTILAYER JOINED BODY MANUFACTURING METHOD, POWER-MODULE SUBSTRATE MANUFACTURING METHOD, HEAT SINK EQUIPPED POWER-MODULE SUBSTRATE MANUFACTURING METHOD, AND LAMINATED BODY MANUFACTURING DEVICE

BACKGROUND OF THE INVENTION

Technical Field

The present invention relates to a manufacturing method of a laminated body structured from a number of members used for manufacturing a power-module substrate of a semiconductor device controlling large electric current and high voltage, a manufacturing method of a power-module substrate, and a manufacturing device of a laminated body.

Priority is claimed on Japanese Patent Application No. 2014-136646 filed Jul. 2, 2014, Japanese Patent Application No. 2014-235949 filed Nov. 20, 2014 and Japanese Patent Application No. 2015-130973 filed Jun. 30, 2015, the content of which is incorporated herein by reference.

Background Art

Conventionally, as a power-module substrate, it is known that a circuit plate is joined on one surface of a ceramic substrate in a laminated state and a heat-radiation plate is joined on another surface of the ceramic substrate in a laminated state. This power-module substrate is formed into a power module by soldering electric elements such as a semiconductor chip (a power element) or the like on the circuit plate and joining a heat sink on the heat-radiation plate.

Methods of joining metal plates to be the circuit plate and the heat-radiation plate on the ceramic substrate in the laminated state for this power-module substrate are described in Patent Documents 1 and 2 for example.

Patent Document 1 discloses a manufacturing method of a power-module substrate having an insulating layer and a circuit layer formed on one surface of the insulating layer. This manufacturing method of power-module substrate has a circuit layer forming process in which the circuit layer is formed by laminating a copper layer on the aluminum layer after arranging an aluminum layer on the one surface of the insulating layer, so that the aluminum layer and the copper layer are solid-phase-diffusion joined by weighting and holding a heating state.

In Patent Document 2, a brazing foil is laminated on one surface of a metal flat plate with a resin-coating layer (including octanediol as organic resin) therebetween beforehand, this stacked body of the metal flat plate and the brazing foil is punched out and formed to have an outer shape of a circuit layer, and the brazing foil which is stacked on the circuit layer is stacked on a ceramic flat plate: so that the circuit layer and the ceramic flat plate are stacked and joined with the brazing foil.

CITATION LIST

Patent Document 1 Japanese Unexamined Patent Application, First Publication No. 2013-229545
Patent Document 2 Japanese Unexamined Patent Application, First Publication No. 2010-10561

SUMMARY OF INVENTION

Technical Problem

According to the manufacturing method of a power-module substrate described in Patent Document 1, the copper layer is stacked after joining the aluminum layer on the insulating layer. However, if merely stacking the aluminum layer and the copper layer directly, these metal members are slipped sideways and a position shift is easy to be occurred (a sideways slip) when installing in a pressurizing tool or pressurizing. Furthermore, if using octanediol as the method described in Patent Document 2, since octanediol is liquid at room temperature, there is a case of slipping sideways because adhesion is not enough. Moreover, problems of the sideways slip between the members may be occurred when stacking the power-module substrate and the heat sink (i.e., laminating metal members) or stacking the metal member and the insulating layer such as the ceramic substrate or the like.

Deterioration of precision of a laminating position owing to the sideways slip between the members causes deterioration of heat radiation property (increase of thermal resistance). Accordingly, it is desired to prevent the position shift.

The present invention is achieved in consideration of the above circumstances, and has an object to provide a joined body manufacturing method that, when joining the metal plates to each other or the metal plate to the ceramic plate, can efficiently manufacture the joined body with preventing the position shift between joining surfaces of each member, and to provide a power-module substrate manufacturing method in which the joined body manufacturing method is applied to a power-module substrate.

Solution to Problem

The present invention has a laminating step forming a laminated body: by coating temporary fixing material including saturated fatty acid as a main ingredient on either a first member made of a metal plate or a second member including one or more of metal plates or ceramic plates; stacking and positioning the first member and the second member with the temporary fixing material therebetween in a state in which the temporary fixing material is melted; and cooling the temporary fixing material to form the laminated body in which the stacked first member and the second member are temporarily joined; and a joining step forming a joined body in which the first member and the second member are joined by heating with pressurizing the laminated body in a stacking direction.

In this manufacturing method, since the first member and the second member are temporarily joined by the temporary fixing material including the saturated fatty acid as the main ingredient, the first member and the second member are not shifted but held in a state in which they are positioned in the joining step after that. Accordingly, subsequent handling is easy, so that it is possible to improve productivity and join the members in an accurately positioned state.

The temporary fixing material, using the saturate fatty acid which is solid in room temperature, is melted by heating and liquefied. Therefore, after laminating the first member and the second member, the first member and the second member can be easily joined by cooling the temporary fixing material to room temperature so as to be solidified. In the joining step, the saturated fatty acid does not influence joining surfaces between the first and second members because the saturated fatty acid is rapidly decomposed at sufficiently lower temperature than joining temperature.

Moreover, the saturated fatty acid has high fluidity in a liquefied melted state and can be spread between the stacked first and second members, so that it is possible to maintain good bondability in a closely adhering state.

Accordingly, it is possible to prevent position shift between the joining surfaces of the members when the first member and the second member which are the metal plates or structured from the metal plate and the ceramic plate and the like are joined, so that the joined body of these can be manufactured efficiently.

In the joined body manufacturing method according to the present invention, it is preferable that a carbon number of the saturated fatty acid of the temporary fixing material be 10 to 30.

If the carbon number is smaller than 10, the handling property is not good because it is liquid in room temperature. If it exceeds 30, workability of applying on the first member or the second member is not good because the melting point is high. Melting point of the saturated fatty acid having the carbon number 10 to 30 is about 32° C. to 94° C.: accordingly, the handling property is good since it is solid at room temperature and can be liquefied at comparatively low heating temperature.

The saturated fatty acid having the carbon number 10 to 30 is, for example, capric acid of carbon number 10, lauric acid of carbon number 12, myristic acid of carbon number 14, palmitic acid of carbon number 16, stearic acid of carbon number 18, melissic acid of carbon number 30, and the like. These saturated fatty acids are inexpensive, so there is an advantage of easiness to obtain.

In the joined body manufacturing method according to the present invention, it is preferable that a joining-material layer be formed on either one surface of the first member or the second member, and the first member and the second member be laminated with the joining-material layer and the temporary fixing material therebetween in the laminating step.

A multilayer joined body manufacturing method according to the present invention applying the above-mentioned joined body manufacturing method includes a second laminating step before the joining step temporarily joining a third member made of a metal plate on the laminated body formed by the laminating step, and in the second laminating step, a second laminated body in which the laminated body and the third member are temporarily joined is formed: by applying a second temporary fixing material including saturated fatty acid with a lower melting point than the temporary fixing material as a main ingredient, on either one of the laminated body or the third body beforehand; melting the second temporary fixing material at lower temperature than melting temperature of the temporary fixing material when stacking the laminated body and the third member; and cooling the second temporary fixing material after positioning and stacking the laminated body and the third body, and in the joining step, by pressurizing and heating the second laminated body in a stacking direction thereof, the multilayer joined body in which the third member is further joined on the joined body in which the first member and the second member are joined.

Also in the multilayer joined body manufacturing method according to the present invention, it is preferable that a carbon number of the saturated fatty acid of the temporary fixing material be 10 to 30. Moreover, it is preferable that a joining-material layer be formed on either one surface of the first member or the second member, and the first member and the second member be stacked with the joining-material layer and the temporary fixing material therebetween in the laminating step. Furthermore, it is preferable that a second joining-material layer be formed on either one surface of the second laminated body or the third member, and the laminated body and the third member be stacked with the second temporary fixing material and the second joining-material layer therebetween in the second laminating step.

A heat sink equipped power-module substrate manufacturing method according to the present invention is a heat sink equipped power-module substrate manufacturing method applying the above-mentioned multilayer joined body manufacturing method, in which the first member is a circuit plate made of copper or aluminum, the second member is a ceramic substrate made by laminating aluminum metal layers on both surfaces of a ceramic plate, the third member is a heat sink made of copper or aluminum, and in the joining step, the heat sink equipped power-module substrate is formed as the multilayer joined body by joining the first member and one of the aluminum metal layers of the second member and joining the third member and the other of the aluminum metal layers of the second member.

A power-module substrate manufacturing method according to the present invention is a power-module substrate manufacturing method applying the above-mentioned joined body manufacturing method, in which the first member is a copper circuit plate, the second member is a ceramic substrate made by laminating aluminum metal layers on both surfaces of a ceramic plate, and in the joining step, the power-module substrate is formed as the joined body by joining the first member and one of the aluminum metal layers of the second member.

A heat sink equipped power-module substrate manufacturing method according to the present invention is a heat sink equipped power-module substrate manufacturing method applying the above-mentioned joined body manufacturing method, in which the first member is a heat sink made of copper or aluminum, the second member is a power-module substrate formed by laminating metal layers on both surfaces of a ceramic plate, and in the joining step, the heat sink equipped power-module substrate is formed as the joined body by joining the first member and one of the metal layers of the second member.

In this heat sink equipped power-module substrate manufacturing method, it is preferable that the joining-material layer be temporarily joined on either one surface of the first member or the second member by temporary fixing material for joining-material layer before the laminating step, and in the laminating step, the temporary fixing material be applied on either one of the first member or the second member on which the joining-material layer is not formed.

A laminated body manufacturing device according to the present invention is a laminated body manufacturing device temporarily-joining a first member made of a metal plate and a second member including one or more of metal plates or ceramic plates in a stacked state with temporary fixing material including saturated fatty acid as a main ingredient therebetween, in which the temporary fixing material is formed on either one of the first member or the second member, and the manufacturing device includes a stacking device stacking the first member and the second member by moving one on which the temporary fixing material is formed onto the other on which the temporary fixing material is not formed, and a heating device melting the temporary fixing material when the first member and the second member are laminated.

The temporary fixing material using the saturated fatty acid which is solid in room temperature is melted by heating; so it is necessary to be heated when the first member and the second member are laminated. Accordingly, by providing the heating device heating the temporary fixing material when laminating the first member and the second member, the first member and the second member can be fixed efficiently.

A laminated body manufacturing device according to the present invention is a laminated body manufacturing device temporarily-joining a first member made of a metal plate and a second member including one or more of metal plates or ceramic plates in a laminated state with temporary fixing material including saturated fatty acid as a main ingredient therebetween, wherein the temporary fixing material is formed on either one of the first member or the second member, including a stacking device stacking the first member and the second member by moving the other on which the temporary fixing material is not formed onto the one on which the temporary fixing material is formed, and a heating device melting the temporary fixing material when the first member and the second member are laminated.

The saturated fatty acid which is the main ingredient of the temporary fixing material has high fluidity in a liquefied melted state. Accordingly, when moving the one plate in which the temporary fixing material is formed, it is desired that the temporary fixing material is solid just before stacking both the members in order to prevent the melted temporary fixing material from sticking to an unnecessary part other than a joining part. Therefore, in the joined body manufacturing device of the present invention, the one plate on which the temporary fixing material is formed is not moved but the other plate is moved; so that the one plate on which the temporary fixing material is formed can be maintained in a stationary state. As a result, it is possible to prevent the temporary fixing material from sticking to the unnecessary part. Accordingly, it is possible to efficiently fix the first member and the second member.

In the laminated body manufacturing device according to the present invention, it is preferable to provide a cooling device which cools the temporary fixing material after laminating the first member and the second member.

By solidifying the melted temporary fixing material by natural cooling, the first member and the second member can be joined. By positively cooling it using the cooling device, it is possible to fix instantly a state in which the first member and the second member are positioned.

Advantageous Effects of Invention

According to the present invention, when joining the metal plates to each other and joining the metal plate and the ceramic plate, the position shift at the joining surfaces between the members can be prevented, so that the joined body of these can be manufactured efficiently.

DESCRIPTION OF EMBODIMENTS

Below, embodiments of the present invention will be explained.

Figure 1:
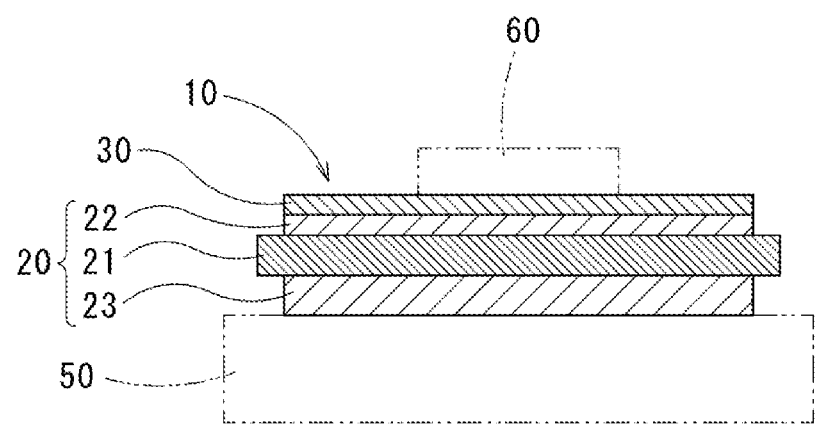
FIG. 1 is a sectional view showing a power-module substrate manufactured in a first embodiment of the present invention.

FIG. 1 shows a power-module substrate 10 manufactured in a first embodiment of the present invention.

This power-module substrate (a joined body of the present invention) 10 is provided with a copper circuit plate (a first member of the present invention) 30 and a ceramic substrate (a second member of the present invention) 20 in which aluminum metal layers 22 and 23 are laminated on both surfaces of a ceramic plate 21; and the one aluminum-metal plate 22 of the ceramic substrate 20 and the copper circuit plate 30 are joined. In this case, the ceramic plate 21 of the ceramic substrate 20, the aluminum metal layers 22 and 23 and the copper circuit plate 30 are formed as a rectangular flat shape.

An electric member 60 such as a semiconductor chip or the like is soldered on a surface of the copper circuit plate 30, and a heat sink 50 is joined on the aluminum metal layer 23 arranged at a counter side to the copper circuit layer 30, so that the power-module substrate 10 is formed as a power module.

The ceramic plate 21 is made into a rectangular shape from nitride ceramics such as MN (aluminum nitride), $Si_3N_4$ (silicon nitride) or the like, or oxide ceramics such as $Al_2O_3$ (alumina) or the like as main ingredient, for example. Thickness of the ceramic plate 21 is 0.125 mm to 1.0 mm.

The aluminum metal layers 22 and 23 are formed usually into a rectangular flat plate smaller than the ceramic plate 21 with thickness 0.1 mm to 3.0 mm, from pure aluminum with purity of 99.90% or higher or aluminum alloy (here, called merely "aluminum"). The aluminum metal layers 22 and 23 are joined on the ceramic plate 21 by brazing material of Al—Si based, Al—Ge based, Al—Cu based, Al—Mg based, or Al—Mn based or the like, which is used as joining material.

The copper circuit plate 30 is made of pure copper such as oxygen-free copper, tough-pitch copper or the like, or copper alloy (here, called merely "copper" in the present invention). Thickness of the copper circuit plate 30 is 0.1 mm to 5.0 mm. The copper circuit layer 30 is joined on the aluminum metal layer 22 of the ceramic substrate 20 by solid-phase-diffusion joining as stated below.

Next, a laminated body manufacturing device 90 (refer to FIG. 3) for producing the power-module substrate 10 which is structured as above will be explained.

The laminated body manufacturing device 90 manufactures a laminated body 80 in which the copper circuit plate (the first member of the present invention) 30 on which a temporary fixing material 40 including saturated fatty acid as main ingredient is formed is temporarily joined on the aluminum metal layer 22 of the ceramic substrate (the second member of the present invention) 20.

The laminated body manufacturing device 90 of the present embodiment is provided with, as shown in FIG. 3, a base table 91 on which the ceramic substrate 20 is arranged, a stacking device 95 moving the copper circuit plate 30 on which the temporary fixing material 40 is formed onto the ceramic substrate 20 which is arranged on the base table 91 and stacking the copper circuit plate 30 and the ceramic substrate 20 with positioning the ceramic substrate 20, and a heating device 96 melting the temporary fixing material 40 when laminating the copper circuit plate 30 and the ceramic substrate 20.

Figure 3A:
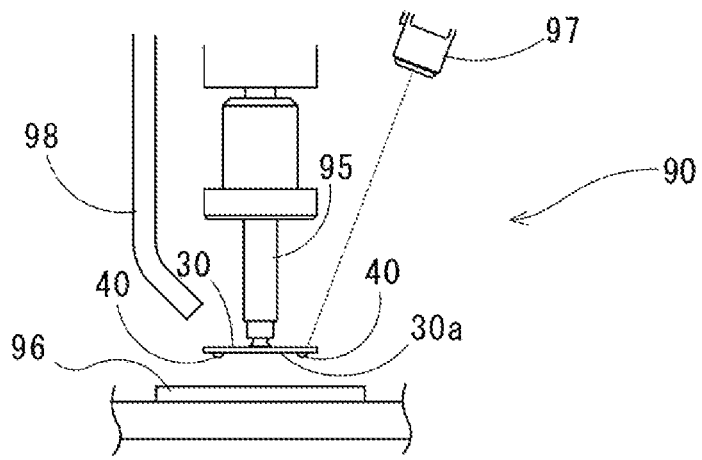
FIG. 3 is a schematic view explaining a layered body manufacturing device according to the present invention.
Figure 3B:
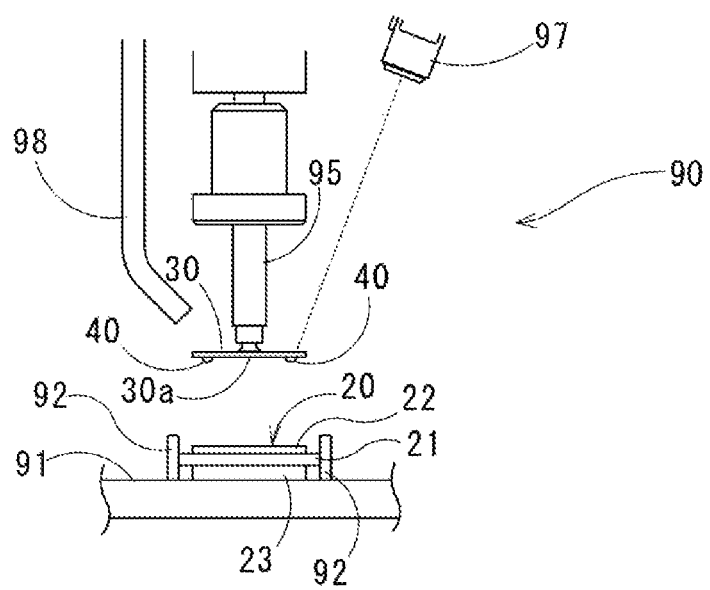
Figure 3C:
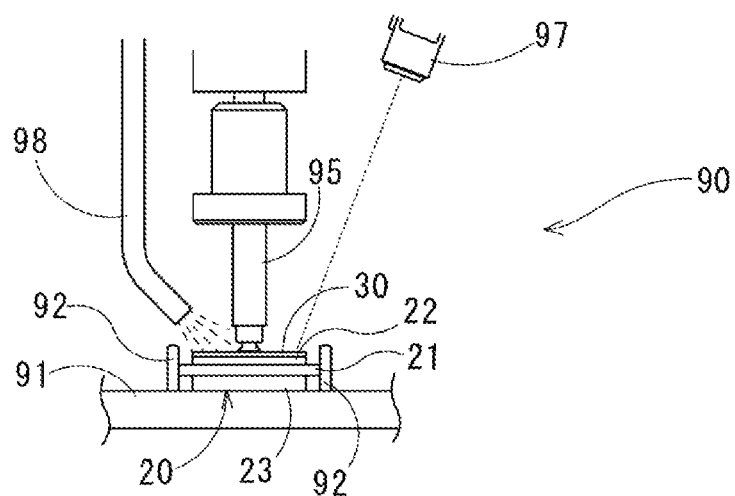

In the base table 91, as shown in FIG. 3B and FIG. 3C, guide pins 92 are provided to stand on an arranging surface of the ceramic substrate 20 with intervals surrounding side surfaces of the ceramic substrate 20. By arranging the ceramic substrate 20 in an area surrounded by these guide pins 92, the ceramic substrate 20 is positioned on the base table 91.

The stacking device 95, as shown in FIG. 3A and FIG. 3B, can be structured by a cylinder unit for picking up and stacking which is installed so as to move along xyz directions, for example. The stacking device 95 stacks the copper circuit plate 30 and the ceramic substrate 20 by moving the copper circuit plate 30 in a state in which an adhering surface 30a is downward to above the base table 91 on which the ceramic substrate 20 is arranged, and stacks the adhering surface 30a of the copper circuit plate 30 on the ceramic substrate 20 on the base table 91. Specifically, as shown in FIG. 3A to FIG. 3C, the copper circuit plate 30 is moved by air-suction at an upper surface which is opposite to the adhering surface 30a of the copper circuit plate 30 by the stacking device 95.

The heating device 96 may be structured by a rubber heater, as shown in FIG. 3A for example. The temporary fixing material 40 on the adhering surface 30a can be heated and melted by arranging the adhering surface 30a of the copper circuit plate 30 to be opposite to the rubber heater (the heating device) 96.

The stacking device 95 is provided with a temperature measuring device 97 for observing the melted state of the temporary fixing material 40 when the copper circuit plate 30 is moved. By measuring the temperature of the copper circuit plate 30 using the temperature measuring device 97, it is possible to confirm the melted states of the temporary fixing material 40 when heating the copper circuit plate 30 by the heating device 96, and before and after stacking the copper circuit plate 30 and the ceramic substrate 20. As the temperature measuring device 97, an infrared thermometer can be used, for example. In the present embodiment, the temperature measuring device 97 measures the temperature of the copper circuit plate 30 held by the stacking device 95.

The laminated body manufacturing device 90 is provided with a cooling device 98 for cooling the copper circuit plate 30 and the ceramic substrate 20 after stacking. The cooling device 98 is provided at the stacking device 95, and may be structured by a cooling nozzle blowing air as shown in FIG. 3C for example.

Next, a method of forming the laminated body 80 and producing the power-module substrate 10 using the above-mentioned laminated body manufacturing device 90 will be explained.

(Applying Step of Temporary Fixing Material)

Figure 2A:
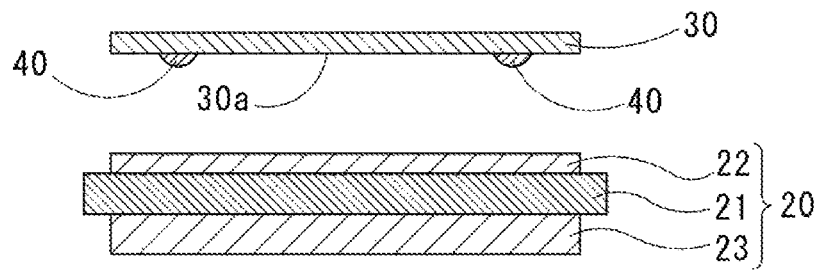
FIG. 2 is a sectional view schematically showing steps of producing the power-module substrate in FIG. 1.

First, the temporary fixing material 40 including saturated fatty acid as a main ingredient is applied on one surface of the copper circuit plate (the first member) 30 as shown in FIG. 2A. For this temporary fixing material 40, preferably used is the saturated fatty acid with a carbon number 10 to 30 which is solid in room temperature (25° C.) and easy to be phase transformed at comparatively low melting point. If the carbon number is smaller than 10, the handling property is not good because it is liquid in room temperature. If it is larger than 30, workability of applying on the copper circuit plate 30 is not good because the melting point is higher.

Melting point of the saturated fatty acid having the carbon number 10 to 30 is about 32° C. to 94° C., accordingly, the handling property is good since it is solid at room temperature and can be liquefied at comparatively low heating temperature.

The saturated fatty acid having the carbon number 10 to 30 is, for example, capric acid of carbon number 10, lauric acid of carbon number 12, myristic acid of carbon number 14, palmitic acid of carbon number 16, stearic acid of carbon number 18, melissic acid of carbon number 30, or the like. These saturated fatty acids are inexpensive, so there is an advantage to be easy to obtain.

An applying operation of the temporary fixing material 40 on the copper circuit plate 30 is, for example, performed by using a hot cylinder unit, though illustration thereof is omitted here. The temporary fixing material 40 is heated to be melted in the hot cylinder unit, and the melted temporary fixing material 40 is dropped on some points such as corner parts and the like at a surface of the copper circuit plate 30. Then, the temporary fixing material 40 dropped on the copper circuit plate 30 is cooled to room temperature and solidified, so that the copper circuit plate 30 to which the temporary fixing material 40 is adhered is formed.

(Laminating Step)

Figure 2B:
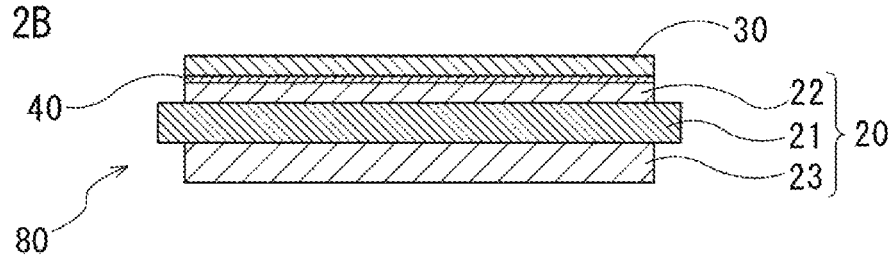

Next, as shown in FIG. 2B, stacking the copper circuit plate 30 on which the temporary fixing material 40 is adhered beforehand and the aluminum metal layer 22 of the ceramic substrate 20, the copper circuit plate 30 and the ceramic substrate 20 are temporarily joined by the temporary fixing material 40.

The copper circuit plate 30 is moved above the base table 91 by the stacking device 95 (FIGS. 3A and 3B) and stacked on the aluminum metal layer 22 of the ceramic substrate 20 arranged on the base table 91 in a positioned state (FIG. 3C).

When the copper circuit plate 30 is moved, the applied temporary fixing material 40 is solidified. In the middle of a moving route of the copper circuit plate 30 by the stacking device 95, the temporary fixing material 40 can be melted by facing the adhering surface 30a of the copper circuit plate 30 to the rubber heater 96 and being heated.

Then, in a state in which the temporary fixing material 40 is melted, as shown in FIG. 2B and FIG. 3C, the copper circuit plate 30 is stacked on the ceramic substrate 20. At this time, by stacking on the ceramic substrate 20, the temporary fixing material 40 adhered to the copper circuit plate 30 is thinly extended to be layered, and closely adhered between the copper circuit plate 30 and the aluminum metal layer 22. Then, the temporary fixing material 40 is cooled by being contact with the aluminum metal layer 22 which is not heated, and solidified. As a result, the laminated body 80 is obtained in a state in which the copper circuit plate 30 and the ceramic substrate 20 are precisely positioned and (temporarily) fixed.

The temporary fixing material 40 can be solidified by natural cooling as described above; in addition, it is possible to solidify by actively cooling using the cooling device 98 as shown in FIG. 3C. In this case, it is possible to immediately fix the positioned state of the copper circuit plate 30 and the ceramic substrate 20. Accordingly, the workability can be further improved.

(Joining Step)

Figure 2C:
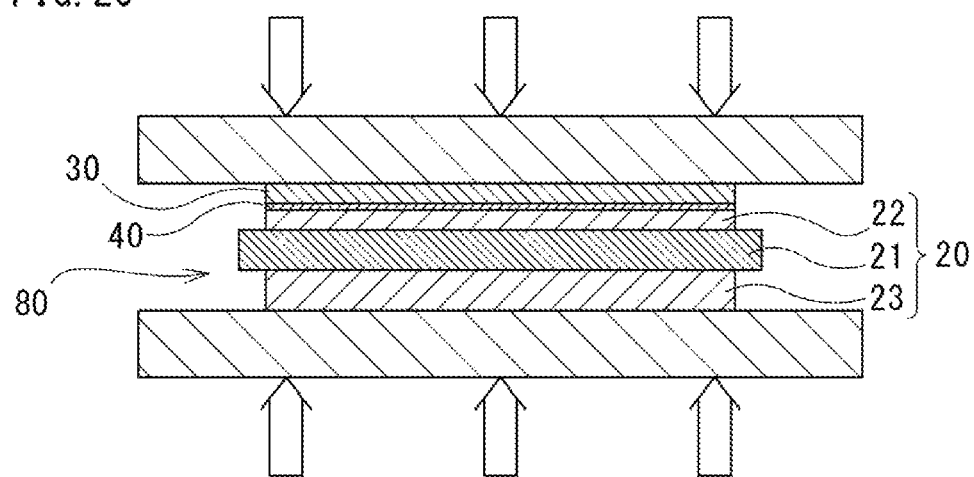

Then, as shown in FIG. 2C, by pressing the laminated body 80 in which the copper circuit plate 30 and the ceramic substrate 20 are temporarily joined in the stacking direction and heating it at a lower temperature than eutectic temperature of copper and aluminum, the copper circuit plate 30 and the aluminum metal layer 22 of the ceramic substrate 20 are joined by solid-phase-diffusion joining in which copper and aluminum are diffused to each other, so that the power-module substrate 10 can be manufactured. Specifically the copper circuit plate 30 and the aluminum metal layer 22 of the ceramic substrate 20 are joined by holding them in vacuum atmosphere, at a load 0.3 MPa to 10 MPa, at heating temperature 400° C. to 548° C., for 5 minutes to 240 minutes. The temporary fixing material 40 is decomposed and disappeared at an initial stage of this heating.

As described above, in the power-module substrate manufacturing method of the present embodiment, since the laminated body 80 in which the copper circuit plate (the first member) 30 and the ceramic substrate 20 are temporarily joined by the temporary fixing material 40 in the laminating step is formed beforehand in the joining step, the position shift between the copper circuit plate 30 and the ceramic substrate 20 can be prevented in the following joining step. Accordingly, it is possible to join the copper circuit plate 30 and the ceramic substrate 20 in the positioned state at a predetermined position precisely.

Therefore, the power-module substrate 10 can be efficiently manufactured, and the productivity can be improved.

In the above-mentioned first embodiment, the temporary fixing material 40 is applied on the copper circuit plate 30 beforehand; and the copper circuit plate 30 is moved and stacked on the aluminum metal layer 22 of the ceramic substrate 20. However, it is permitted that the temporary fixing material 40 is applied on the aluminum metal layer 22 of the ceramic substrate 20 beforehand, and the copper circuit plate 30 is stacked thereon.

In this case, by stacking the heated copper circuit plate 30 on the aluminum metal layer 22 on which the temporary fixing material 40 is applied, the temporary fixing material 40 is melted by the heat of the copper circuit plate 30, so that the copper circuit plate 30 and the aluminum metal layer 22 can be closely adhered. Then, the temporary fixing material 40 is cooled by the aluminum metal layer 22 and solidified; and it is possible to fix the copper circuit plate 30 and the aluminum metal layer 22.

In this case, instead of the ceramic substrate 20 on which the temporary fixing material 40 is formed, but the copper circuit plate 30 is moved; accordingly, the ceramic substrate 20 on which the temporary fixing material 40 is formed is in a stationary state. Therefore, the melted temporary fixing material 40 is prevented from adhering to an unnecessary part other than joining parts; and the copper circuit plate 30 and the ceramic substrate 20 are efficiently fixed.

In addition, the ceramic substrate 20 can be laminated on the copper circuit plate 30 by sucking the ceramic substrate 20 on which the temporary fixing material 40 is applied and moving it above the base table 91 on which the copper circuit plate 30 is arranged.

In the first embodiment, the temporary fixing material 40 is dropped on the copper circuit plate 30 and then temporarily cooled to room temperature so as to be solidified; and then the temporary fixing material 40 is heated to be melted again when the copper circuit plate 30 is stacked on the ceramic substrate 20; so the copper circuit plate 30 and the ceramic substrate 20 are temporarily fixed. In addition, it is possible to adhere by stacking the copper circuit plate 30 and the ceramic substrate 20 before the dropped temporary fixing material is cooled.

Figure 4A:
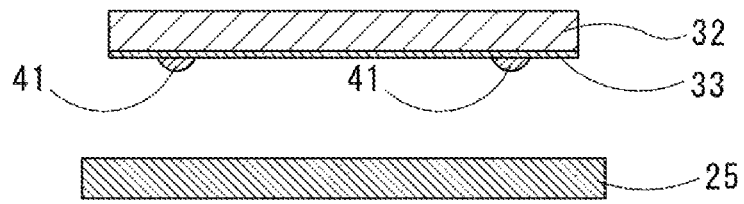
FIG. 4 is a schematic view explaining a manufacturing method of a second embodiment of the present invention.
Figure 4B:
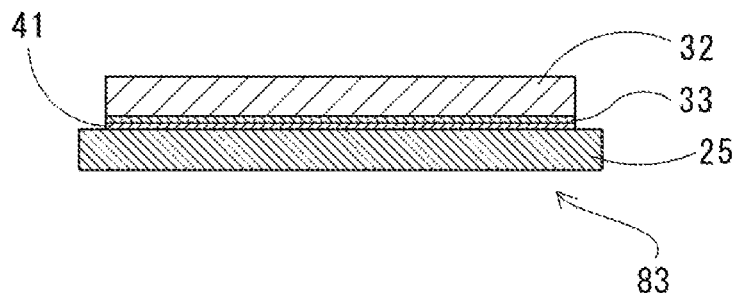
Figure 4C:
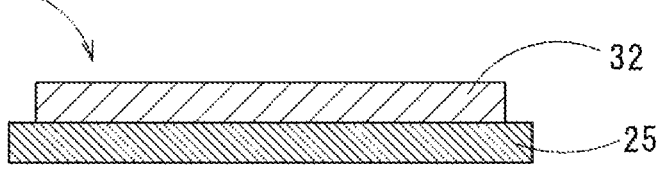

FIG. 4 shows a second embodiment of the present invention; and FIG. 4C shows a power-module substrate (a joined body of the present invention) 11 manufactured by the present invention. This power-module substrate 11 is provided with an aluminum metal layer (a first member of the present invention) 32, and a ceramic plate (a second member of the present invention) 25 joined to this aluminum metal layer 32. In this case, the aluminum metal layer 32 and the ceramic plate 25 are formed to have a rectangular flat shape.

In order to manufacture the power-module substrate 11 structured as above, on one surface of the aluminum metal layer 32, as shown in FIG. 4A, a brazing foil is adhered by ultrasonic joining or the like, so as to form a joining-material layer 33 by this brazing foil beforehand. On a surface of the joining-material layer 33, a temporary fixing material 41 including saturated fatty acid as a main ingredient is applied beforehand, as in the laminating step in the first embodiment. Then, by stacking the aluminum metal layer 32 and the ceramic plate 25 with the joining-material layer 33 therebetween in a state in which the temporary fixing material 41 is melted, the melted temporary fixing material 41 is thinly extended to be layered between the ceramic plate 25 and the joining-material layer 33 on the aluminum metal layer 32, so the ceramic plate 25 and the aluminum metal layer 32 are closely adhered. Subsequently, by cooling the temporary fixing material 41 in a state in which the ceramic plate 25 and the aluminum metal layer 32 are positioned, a laminated body 83 is formed in which the ceramic plate 25 and the aluminum metal layer 32 are temporarily joined (a laminating step).

Similarly to the first embodiment, by pressing the laminated body of the ceramic plate 25 and the aluminum metal layer 32 in the stacking direction and heating them in vacuum, the ceramic plate 25 and the aluminum metal layer 32 are brazed by the joining-material layer 33 arranged therebetween, so that the power-module substrate 11 can be manufactured (a joining step).

In the second embodiment, the temporary fixing material 41 is adhered to the surface of the joining-material layer 33 of the aluminum metal layer 32. However, the temporary fixing material 41 can be adhered to the surface of the ceramic plate 25.

Figure 5A:
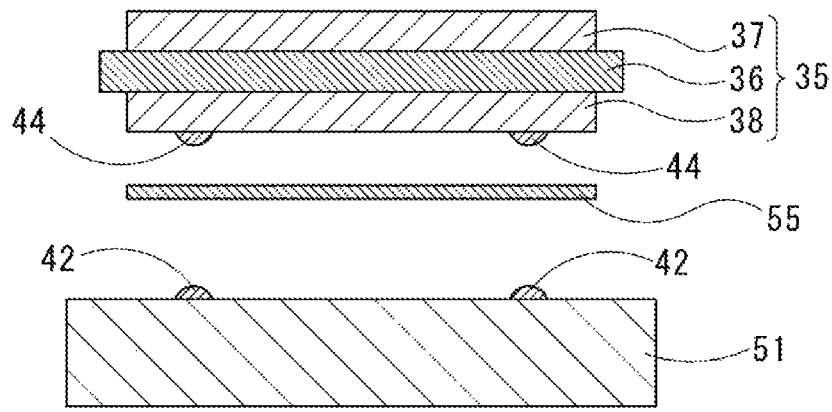
FIG. 5 is a schematic view explaining a manufacturing method of a third embodiment of the present invention.
Figure 5B:
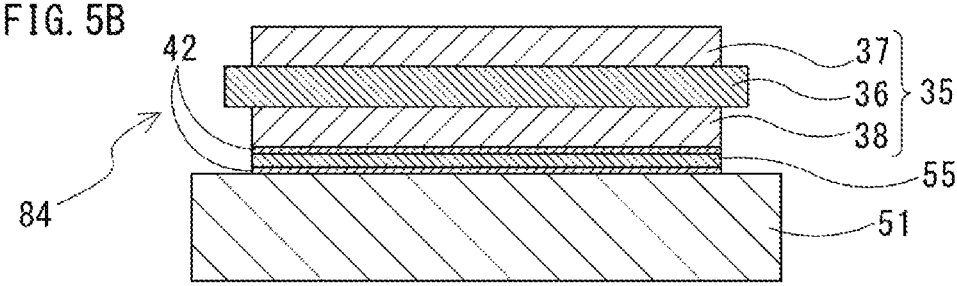
Figure 5C:
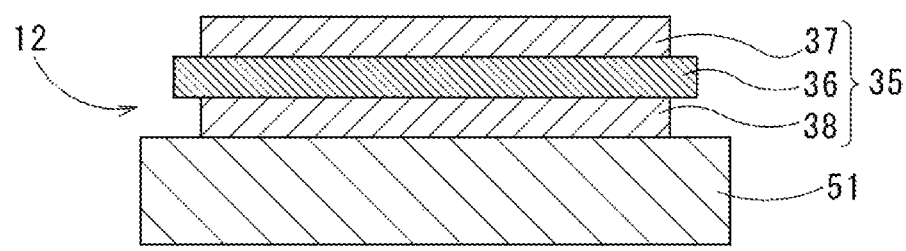

FIG. 5 shows a third embodiment of the present invention. FIG. 5C shows a heat sink equipped power-module substrate (a joined body of the present invention) 12 manufactured by the present invention. The heat sink equipped power-module substrate 12 is provided with a heat sink (a first member of the present invention) 51 and a power-module substrate (a second member of the present invention) 35 in which aluminum metal layers 37 and 38 are brazed on both surfaces of a ceramic plate 36; and manufactured by joining the one aluminum metal layer 38 of the power-module substrate 35 and the heat sink 51. The heat sink 51 is formed into a rectangular flat plate from pure aluminum having purity of 99.90% or higher or aluminum alloy (here, called merely "aluminum").

In order to manufacture the heat sink equipped power-module substrate 12 structure as above, a joining-material layer 55 is formed beforehand on either one of the aluminum metal layer 38 of the power-module substrate 35 or the heat sink 51. As the joining-material layer 55, can be employed a clad material which is formed to have three layers by laminating Al—Si—Mg based brazing material on both surfaces of an aluminum alloy plate of 3003 series, for example.

As shown in FIG. 5A, on a surface of the aluminum metal layer 38, a temporary fixing material 44 for joining-material layer including saturated fatty acid as a main ingredient is applied beforehand; and the joining-material layer 55 is stacked in a state in which the temporary fixing material 44 for joining-material layer is melted, so that the aluminum metal layer 38 and the joining-material layer 55 are closely adhered by the temporary fixing material 44 for joining-material layer therebetween. Then, by cooling the temporary fixing material 44 for joining-material layer in a state in which the aluminum metal layer 38 and the joining-material layer 55 are positioned, the aluminum metal layer 38 and the joining-material layer 55 are joined (temporarily fixed).

Furthermore, a temporary fixing material 42 which is the same as the temporary fixing material 44 for joining-material layer is applied beforehand on a surface of the heat sink 51 as well, and the power-module substrate 35 to which the joining-material layer 55 is adhered is stacked on the heat sink 51 in a state in which the temporary fixing material 42 is melted; so that the power-module substrate 35 and the heat sink 51 are closely adhered. Then, by cooling the temporary fixing material 42 in a state in which the power-module substrate 35 and the heat sink 51 are positioned, a laminated body 84 in which the power-module substrate 35 and the heat sink 51 are temporarily fixed is formed (a laminating step).

By heating this laminated body 84 (the power-module substrate 35 and the heat sink 51) under atmospheric pressure and in nitrogen atmosphere in a state of pressing in the stacking direction, the power-module substrate 35 and the heat sink 51 are brazed by the joining-material layer 55 therebetween, and the heat sink equipped power-module substrate 12 is manufactured (a joining step).

FIG. 6 shows a fourth embodiment of the present invention. FIG. 6C shows a heat sink equipped power-module substrate (a joined body of the present invention) 13 manufactured by the present invention. The heat sink equipped power-module substrate 13 is provided with a heat sink (a first member of the present invention) 52 and a power-module substrate (a second member of the present invention) 45 in which aluminum metal layers 47 and 48 are brazed on both surfaces of a ceramic plate 46, and manufactured by joining the one aluminum metal layer 48 of the power-module substrate 45 and the heat sink 52. The heat sink 52 is formed into a rectangular flat shape from pure copper or copper alloy (here, called merely "copper").

Figure 6A:
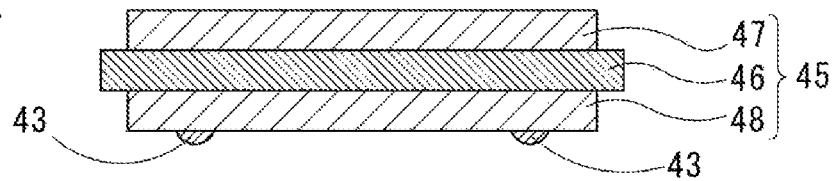
FIG. 6 is a schematic view explaining a manufacturing method of a fourth embodiment of the present invention.
Figure 6A:
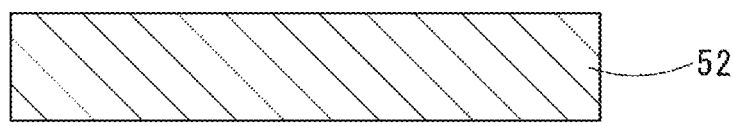
Figure 6B:
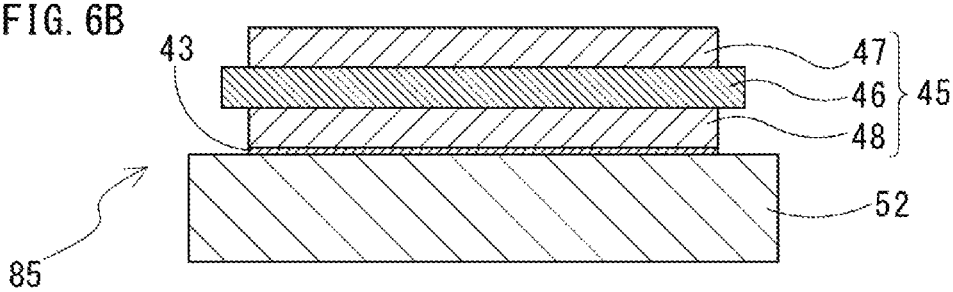
Figure 6C:
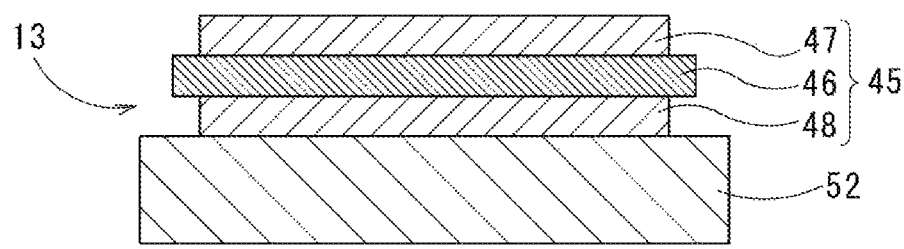

In order to manufacture the heat sink equipped power-module substrate 13 structured as above, as shown in FIG. 6A, temporary fixing material 43 including saturated fatty acid as a main ingredient is applied on a power-module substrate 45; and the heat sink 52 is stacked in a state in which the temporary fixing material 43 is melted, so that the power-module substrate 45 and the heat sink 52 are closely adhered by the temporary fixing material 43 therebetween. Then, cooling the temporary fixing material 43 in a state in which the power-module substrate 45 and the heat sink 52 are positioned, a laminated body 85 in which the power-module substrate 45 and the heat sink 52 are temporarily fixed by the temporary fixing material 43 is formed (a laminating step).

Similarly to the first embodiment, by pressing the laminated body 85 in the stacking direction in a state in which the power-module substrate 45 and the heat sink 52 are temporarily joined and heating it at a temperature lower than eutectic temperature of copper and aluminum, the aluminum metal layer 48 of the power-module substrate 45 and the heat sink 52 are joined by solid-phase diffusion joining in which copper and aluminum are diffused to each other, so that the heat sink equipped power-module substrate 13 is manufactured (a joining step).

Figure 7A:
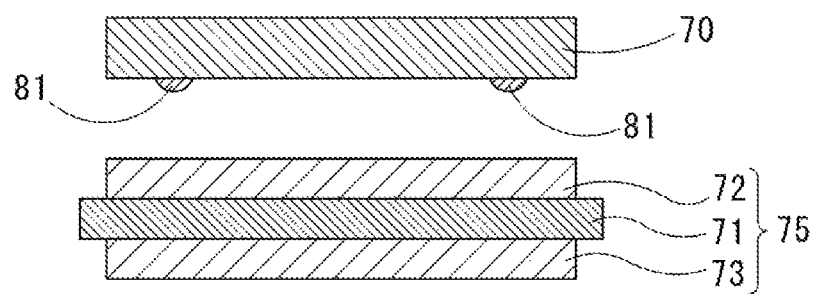
FIG. 7 is a schematic view explaining a manufacturing method of a fifth embodiment of the present invention.
Figure 7B:
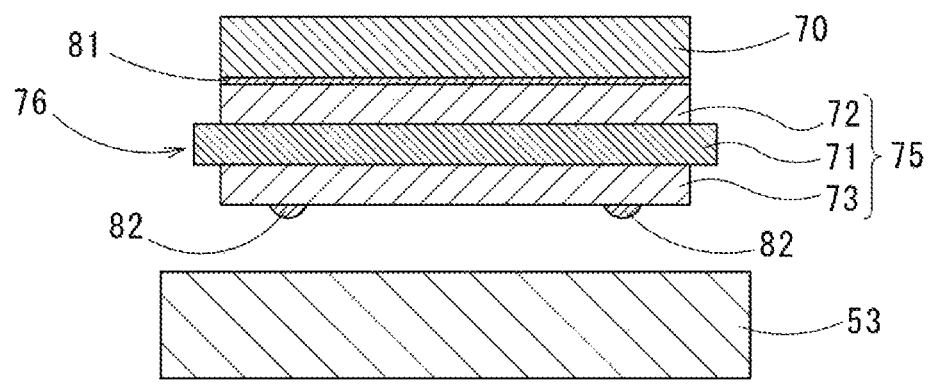
Figure 7C:
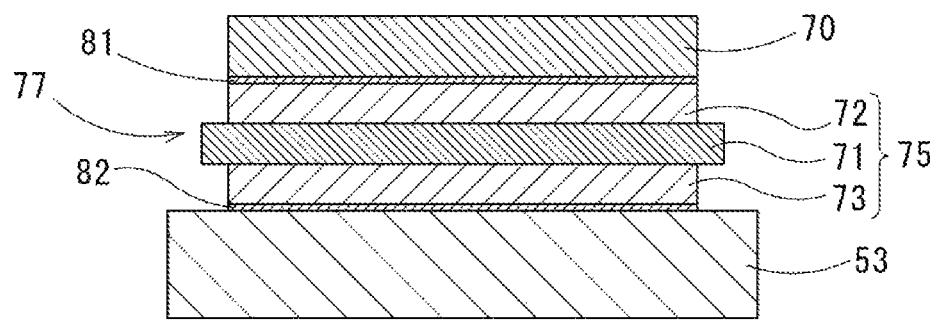
Figure 7D:
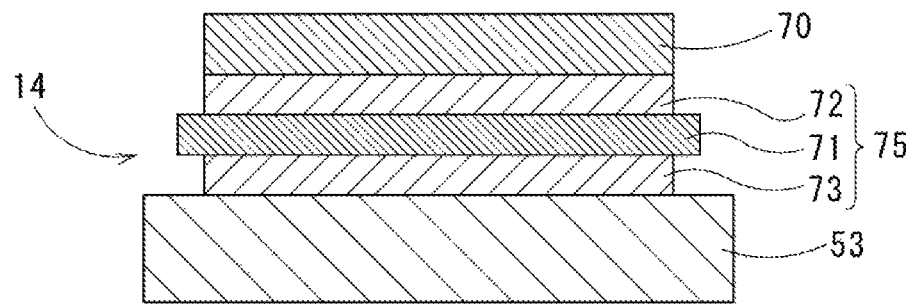

FIG. 7 shows a fifth embodiment of the present invention; and FIG. 7D shows a heat sink equipped power-module substrate (a multilayer joined body of the present invention) 14 manufactured by the present invention. The heat sink equipped power-module substrate 14 is provided with a copper circuit plate (a first member of the present invention) 70, a ceramic substrate (a second member of the present invention) 75 in which aluminum metal layers 72 and 73 are laminated on both surfaces of a ceramic plate 71, and a heat sink (a third member of the present invention) 53. The heat sink equipped power-module substrate 14 is manufactured by joining the one aluminum metal layer 72 of the ceramic substrate 75 and the copper circuit plate 70 and joining the other aluminum metal layer 73 and the heat sink 53. The heat sink 53 is made from pure copper or copper alloy (here, called merely as "copper") into a rectangular flat plate.

In order to manufacture the heat sink equipped power-module substrate 14 structured as above, as shown in FIG. 7A and FIG. 7B, a temporary fixing material 81 including saturated fatty acid as a main ingredient is applied on the copper circuit plate 70 beforehand, and the ceramic substrate 75 is stacked thereon in a state in which the temporary fixing material 81 is melted; so that the ceramic substrate 75 and the copper circuit plate 70 are closely adhered with the temporary fixing material 81 therebetween. Then, by cooling the temporary fixing material 81 in a state in which the ceramic substrate 75 and the copper circuit plate 70 are positioned, a laminated body 76 in which the ceramic substrate 75 and the copper circuit plate 70 are temporarily fixed by the temporary fixing material 81 is formed (a laminating step).

The temporary fixing material 81 can be adhered also on a surface of the ceramic substrate 75 (the aluminum metal layer 72) other than the copper circuit plate 70.

Next, as shown in FIG. 7B and FIG. 7C, the laminated body 76, which is formed in the laminating step by temporarily fixing the ceramic substrate 75 and the copper circuit plate 70, is temporarily fixed on the heat sink (the third member of the present invention) 53 by a second temporary fixing material 82 including saturated fatty acid as a main ingredient and having lower melting point than that of the temporary fixing material 81 (a second laminating step). For example, in a case in which the temporary fixing material 81 includes stearic acid (a carbon number 18, melting point about 70° C.) as a main ingredient, it is preferable to use the second temporary fixing material 82 including lauric acid (a carbon number 12, melting point about 44° C.) with a melting point sufficiently lower than that of stearic acid.

When the laminated body 76 and the heat sink 53 are laminated, the second temporary fixing material 82 is applied beforehand on the aluminum metal layer 73 of the laminated body 76, and the second temporary fixing material 82 is melted at lower temperature than the melting temperature of the temporary fixing material 81; then the laminated body 76 and the heat sink 53 are stacked with positioning, so that the laminated body 76 and the heat sink 53 are closely adhered by the second temporary fixing material 82 therebetween. Subsequently, by cooling the second temporary fixing material 82, the laminated body 76 and the heat sink 53 are fixed by the second temporary fixing material 82, so that a second laminated body 77 in which the laminated body 76 and the heat sink 53 are temporarily fixed is formed (a second laminating step).

Also in this second laminating step, the second temporary fixing material 82 can be adhered on a surface of the heat sink 53 other than the aluminum metal layer 73 of the laminated body 76.

In this second laminating step, since using the second temporary fixing material 82 having lower melting point than the melting point of the temporary fixing material 81 which temporarily fixes the copper circuit plate 70 and the ceramic substrate 75, the temporary fixing material 81 is not melted, and the heat sink 53 can be temporarily fixed in a state in which the copper circuit plate 70 and the ceramic substrate 75 are fixed. In other words, in the second laminating step, the laminated body 76 and the heat sink 53 in which the copper circuit plate 70 and the ceramic substrate 75 are stacked can be temporarily fixed without shifting the position between the copper circuit plate 70 and the ceramic substrate 75. Accordingly, three members, the copper circuit plate 70, the ceramic substrate 75, and the heat sink 53 can be fixed with an accurate position.

Similarly to the first embodiment, the second laminated body 77 which is formed by temporarily fixing the copper circuit plate 70, the ceramic substrate 75 and the heat sink 53 is pressed in the stacking direction and heated at lower temperature than the eutectic temperature of copper and aluminum; as a result, they can be joined by solid-phase-diffusion joining by diffusing copper and aluminum to each other (a joining step). As described above, the copper circuit plate 70, the ceramic substrate 75, and the heat sink 53 can be concurrently joined by the heat sink equipped power-module substrate manufacturing method according to the fifth embodiment, so that the heat sink equipped power-module substrate 14 can be efficiently manufactured.

In the above described fifth embodiment, the heat sink equipped power-module substrate 14 is manufactured by joining the one aluminum metal layer 72 of the ceramic substrate 75 and the copper circuit plate 70, and joining the other aluminum metal layer 73 and the copper-made heat sink 53 by the solid-phase-diffusion joining between copper and aluminum; however, it is acceptable that an aluminum circuit plate is joined on the aluminum metal layer 72 of the ceramic substrate 73 and an aluminum-made heat sink is joined on the aluminum metal layer 73. In this case, on either one of the aluminum metal layer 72 of the ceramic substrate 75 and the circuit plate and either one of the aluminum metal layer 73 and the heat sink, joining-material layers are respectively formed beforehand, and these members are stacked and temporarily fixed with the respective joining-material layers therebetween. As the joining-material layers, for example, a clad material which is formed to have three layers by laminating Al—Si—Mg based brazing material on both surfaces of an aluminum alloy plate of 3003 series can be employed.

EXAMPLES

Next, Invention Examples and comparative examples for confirmation of effects of the present invention will be explained.

(Test 1)

As Conventional Examples and Invention Examples, laminated body were formed by dropping temporary fixing materials shown in Table 1 on rectangle copper plates of 30 mm×30 mm, thickness 1.0 mm, and stacking and temporarily fixing rectangle aluminum plates of 25 mm×25 mm, thickness 0.6 mm thereon. Modeling a moving state of the laminated bodies, the copper plates of the laminated bodies were shaken horizontally at a speed about 30 mm/s; and confirming position shift of the aluminum plates by looking, bondability of the laminated bodies which were temporarily fixed were evaluated. If the position shift was not larger than 1 mm, it was evaluated as "excellent". If the position shift was larger than 1 mm and smaller than 10 mm, it was evaluated as "good". If the position shift was not smaller than 10 mm, it was evaluated as "bad".

(Test 2)

Joined bodies were formed from the laminated bodies by pressing in the stacking direction at 1.0 MPa in vacuum atmosphere and heating at 540° C. for 60 minutes. With respect to the joined bodies, modeling a usage state of the joined bodies, in an initial state after joining and a state after 3000 times of thermal cycling between −40° C. and 100° C., existence of unjoined parts at joining surfaces between the copper plate and the aluminum plate were observed by an ultrasonic image measuring device. If there was not an unjoined part larger than 2% in the joining surfaces, it was evaluated as "excellent". If there was an unjoined part not smaller than 5% or a void in which a diameter thereof is not smaller than 2 mm, it was evaluated as (bad). Or else, if there is a small unjoined part which is not fit with the above cases, it was evaluated as "good". These results are shown in Table 1.

TABLE 1

| Examples | Type of Temporary Fixing Material | Melting Point | Test 1 | Test 2 |
|---|---|---|---|---|
| Conventional | Octanediol | −40° C. | BAD | EXCELLENT |
| Invention: 1 | Caprylic Acid: $CH_3$—$(CH_2)_6$—COOH | approx. 17° C. | GOOD | EXCELLENT |
| Invention: 2 | Capric Acid: $CH_3$—$(CH_2)_8$—COOH | approx. 32° C. | EXCELLENT | EXCELLENT |
| Invention: 3 | Lauric Acid : $CH_3$—$(CH_2)_{10}$—COOH | approx. 44° C. | EXCELLENT | EXCELLENT |
| Invention: 4 | Myristic Acid: $CH_3$—$(CH_2)_{12}$—COOH | approx. 54° C. | EXCELLENT | EXCELLENT |
| Invention: 5 | Palmitic Acid: $CH_3$—$(CH_2)_{14}$—COOH | approx. 63° C. | EXCELLENT | EXCELLENT |
| Invention: 6 | Stearic Acid: $CH_3$—$(CH_2)_{16}$—COOH | approx. 70° C. | EXCELLENT | EXCELLENT |
| Invention: 7 | Melissic Acid: $CH_3$—$(CH_2)_{28}$—COOH | approx. 94° C. | EXCELLENT | EXCELLENT |

As recognized from Table 1, in Invention Examples 1 to 7 in which the copper plates and the aluminum plates were joined by the temporary fixing material, it was confirmed that the position shifts between the copper plates and the aluminum plates in the laminated body were small and handling workability thereafter was good. Moreover, without exerting bad influence as separation of the joining-material layer, it is possible to obtain joining surfaces having high reliability.

Especially, it was confirmed that, in Invention Examples 2 to 7 in which the temporary fixing materials having carbon number 10 or larger were used, there was scarcely the position shift, without exerting the bad influence as the separation the joining-material layer, and it is possible to obtain the joining surfaces having high reliability.

The present invention is not limited to the above-described embodiments and various modifications may be made without departing from the scope of the present invention.

For example, explained were the embodiments of cases of manufacturing the power-module substrate in which the copper circuit plate and the aluminum metal layer are joined and the aluminum metal layer and the ceramic substrate are joined; in the other structures of the power-module substrates, the present invention may be applied when the first member made from a metal plate and the second member made from a metal plate or a ceramic plate are joined.

It is not limited to the power module substrate, the present invention may be applied to a case of manufacturing a joined body of the first member and the second member used for the other purpose than a power module, and further may include a case of joining laminated bodies of these without both pressing and heating.

Moreover, although the joined body is manufactured from the first member and the second member in a relation of one-to-one in the above embodiments, it is not limited to this. The present invention may be applied to cases of manufacturing various laminated bodies and joined bodies: for example, in a case in which two or more first members are joined to one second member.

INDUSTRIAL APPLICABILITY

The positions of the joining surfaces of the members can be prevented from shifting when joining the metal plates to each other or joining the metal plate and the ceramic plate: so that the joined body of these can be efficiently manufactured.

REFERENCE SIGNS LIST 10, 11 power-module substrate (joined body)
12, 13 heat sink equipped power-module substrate (joined body)
14 heat sink equipped power-module substrate (multilayer joined body)
20, 75 ceramic substrate (second member)
21, 36, 46, 71 ceramic plate
22, 23, 37, 38, 47, 48, 72, 73 aluminum metal layer
25 ceramic plate (second member)
30, 70 copper circuit plate (first member)
30a adhering surface
32 aluminum metal layer (first member)
33, 55 joining-material layer
35, 45 power-module substrate (second member)
40, 41, 42, 43, 81 temporary fixing material
44 temporary fixing material for joining-material layer
50 heat sink
51, 52 heat sink (first member)
53 heat sink (third member)
60 electric member
76, 80, 83, 84, 85 laminated body
77 second laminated body
82 second temporary fixing material
90 manufacturing device
91 base table
92 guide pin
95 stacking device
96 heating device (rubber heater)
97 temperature measuring device
98 cooling device

The invention claimed is:

1. A joined body manufacturing method comprising:
a temporary fixing material coating step coating a temporary fixing material which is solid at 25° C. including saturated fatty acid as a main ingredient on either a first member or a second member, wherein the first member is made of a metal plate, and the second member includes one or more of metal plates or ceramic plates;
a laminating step forming a laminated body by stacking and positioning the first member and the second member with the temporary fixing material therebetween in a state in which the temporary fixing material is melted; and cooling the temporary fixing material, to form the laminated body in which the stacked first member and the second member are temporarily joined;
and a joining step forming a joined body in which the first member and the second member are joined by heating with pressurizing the laminated body in a stacking direction,
wherein in the temporary fixing material coating step, the temporary fixing material is heated to be melted, coated on either one member of the first member or the second member, and cooled to be solidified on the one member,
wherein in the laminating step, the temporary fixing material solidified on the one member is heated to be melted before stacking the first member and the second member, and
wherein the temporary fixing material is decomposed and disappeared by heating in the joining step.

2. The joined body manufacturing method according to claim 1, wherein a carbon number of the saturated fatty acid of the temporary fixing material is larger than or equal to 10 and smaller than or equal to 30.

3. The joined body manufacturing method according to claim 1, wherein a joining-material layer is formed on either one surface of the first member or the second member, and the first member and the second member are laminated with the joining-material layer and the temporary fixing material therebetween in the laminating step.

4. A multilayer joined body manufacturing method applying the joined body manufacturing method according to claim 1, comprising a second laminating step before the joining step, by temporarily joining a third member made of a metal plate on the laminated body formed by the laminating step, wherein in the second laminating step, a second laminated body in which the laminated body and the third member are temporarily joined is formed, by applying a second temporary fixing material including saturated fatty acid with a lower melting point than the temporary fixing material as a main ingredient, on either one of the laminated body or the third body beforehand; melting the second temporary fixing material at lower temperature than melting temperature of the temporary fixing material when stacking the laminated body and the third member; and cooling the second temporary fixing material after positioning and stacking the laminated body and the third body, and in the joining step, by pressurizing and heating the second laminated body in a stacking direction thereof, the multilayer joined body in which the third member is further joined on the joined body in which the first member and the second member are joined.

5. The multilayer joined body manufacturing method according to claim 4, wherein a carbon number of the saturated fatty acid of the temporary fixing material is larger than or equal to 10 and smaller than or equal to 30.

6. The multilayer joined body manufacturing method according to claim 4, wherein a joining-material layer is formed on either one surface of the first member or the second member, and the first member and the second member are stacked with the joining-material layer and the temporary fixing material therebetween in the laminating step.

7. The multilayer joined body manufacturing method according to claim 4, wherein a second joining-material layer is formed on either one surface of the second laminated body or the third member, and the laminated body and the third member are stacked with the second temporary fixing material and the second joining-material layer therebetween in the second laminating step.

8. A heat sink equipped power-module substrate manufacturing method applying the multilayer joined body manufacturing method according to claim 4, wherein the first member is a circuit plate made of copper or aluminum, the second member is a ceramic substrate made by laminating aluminum metal layers on both surfaces of a ceramic plate, the third member is a heat sink made of copper or aluminum, and in the joining step, the heat sink equipped power-module substrate is formed as the multilayer joined body by joining the first member and one of the aluminum metal layers of the second member and joining the third member and the other of the aluminum metal layers of the second member.

9. The heat sink equipped power-module substrate manufacturing method according to claim 8, wherein a carbon number of the saturated fatty acid of the temporary fixing material is larger than or equal to 10 and smaller than or equal to 30.

10. The heat sink equipped power-module substrate manufacturing method according to claim 8, wherein a joining-material layer is formed on either one surface of the first member or the second member, and the first member and the second member are stacked with the joining-material layer and the temporary fixing material therebetween in the laminating step.

11. The heat sink equipped power-module substrate manufacturing method according to claim 8, wherein a second joining-material layer is formed on either one surface of the second laminated body or the third member, and the laminated body and the third member are stacked with the second temporary fixing material and the second joining-material layer therebetween in the second laminating step.

12. A power-module substrate manufacturing method applying the joined body manufacturing method according to claim 1, wherein the first member is a copper circuit plate, the second member is a ceramic substrate made by laminating aluminum metal layers on both surfaces of a ceramic plate, and in the joining step, the power-module substrate is formed as the joined body by joining the first member and one of the aluminum metal layers of the second member.

13. The power-module substrate manufacturing method according to claim 12, wherein a carbon number of the saturated fatty acid of the temporary fixing material is larger than or equal to 10 and smaller than or equal to 30.

14. The power-module substrate manufacturing method according to claim 12, wherein a joining-material layer is formed on either one surface of the first member or the second member, and the first member and the second member are stacked with the joining-material layer and the temporary fixing material therebetween in the laminating step.

15. A heat sink equipped power-module substrate manufacturing method applying the joined body manufacturing method according to claim 1, wherein the first member is a heat sink made of copper or aluminum, the second member is a power-module substrate formed by laminating metal layers on both surfaces of a ceramic plate, and in the joining step, the heat sink equipped power-module substrate is formed as the joined body by joining the first member and one of the metal layers of the second member.

16. The heat sink equipped power-module substrate manufacturing method according to claim 15, wherein a carbon number of the saturated fatty acid of the temporary fixing material is larger than or equal to 10 and smaller than or equal to 30.

17. The heat sink equipped power-module substrate manufacturing method according to claim 15, wherein a joining-material layer is formed on either one surface of the first member or the second member, and in the laminating step, the first member and the second member are stacked with the joining-material layer and the temporary fixing material therebetween.

18. The heat sink equipped power-module substrate manufacturing method according to claim 17, wherein before the laminating step, the joining-material layer is temporarily joined on either one surface of the first member or the second member by temporary fixing material for joining-material layer, and in the laminating step, the temporary fixing material is applied on either one of the first member or the second member on which the joining-material layer is not formed.

* * * * *